(12) United States Patent
Kruse et al.

(10) Patent No.: US 12,379,617 B2
(45) Date of Patent: Aug. 5, 2025

(54) ELECTRO-OPTICAL MIXER

(71) Applicant: UNIVERSITÄT PADERBORN, Paderborn (DE)

(72) Inventors: Stephan Kruse, Paderborn (DE); Johann Christoph Scheytt, Dorsten (DE)

(73) Assignee: UNIVERSITÄT PADERBORN, Paderborn (DE)

( * ) Notice: Subject to any disclaimer, the term of this patent is extended or adjusted under 35 U.S.C. 154(b) by 0 days.

(21) Appl. No.: 18/833,236

(22) PCT Filed: Feb. 1, 2023

(86) PCT No.: PCT/EP2023/052423
§ 371 (c)(1),
(2) Date: Jul. 25, 2024

(87) PCT Pub. No.: WO2023/148207
PCT Pub. Date: Aug. 10, 2023

(65) Prior Publication Data
US 2025/0110357 A1    Apr. 3, 2025

(30) Foreign Application Priority Data
Feb. 1, 2022   (DE) .................... 10 2022 201 070.1

(51) Int. Cl.
*G02F 1/01*   (2006.01)
*G02F 1/21*   (2006.01)
(Continued)

(52) U.S. Cl.
CPC ............ *G02F 1/0123* (2013.01); *G02F 1/212* (2021.01); *H03F 1/083* (2013.01); *H03F 3/087* (2013.01)

(58) Field of Classification Search
CPC ........ G02F 1/0123; G02F 1/212; H03F 1/083; H03F 1/087
(Continued)

(56) References Cited

U.S. PATENT DOCUMENTS 8,405,461 B2 *   3/2013   Moto ..................... H03F 3/087
                                                            330/69
2001/0050333 A1 * 12/2001 Feng ..................... H03F 3/087
                                                            250/214 A
(Continued)

FOREIGN PATENT DOCUMENTS

DE         4002356       2/1991
DE       102017111197   11/2018
(Continued)

OTHER PUBLICATIONS

Grant Decision for Germany Patent Application No. 102022201070.1, dated Jun. 30, 2023, 14 pages.
(Continued)

*Primary Examiner* — Dalzid E Singh
(74) *Attorney, Agent, or Firm* — Sheridan Ross P.C.

(57) ABSTRACT

The invention relates to an electro-optical mixer having an electrical output, the electro-optical mixer including:
a photodiode for converting an incident optical signal,
a first terminal,
a second terminal,
where a first voltage supply can be connected to the first terminal and a second voltage supply can be connected to the second terminal, or a first power supply can be connected to the first terminal and a second power supply can be connected to the second terminal,
a terminal for a small-signal ground potential for the first voltage supply and the second voltage supply,
a first partial matching network which is arranged on the anode side of the photodiode, wherein a portion of the
(Continued)

first partial matching network is switchably connectable to the terminal for the second voltage supply, and wherein another portion of the first partial matching network is switchably connectable to the terminal for the small-signal ground potential, and a second partial matching network which is arranged on the cathode side of the photodiode, wherein a portion of the second partial matching network is switchably connectable to the terminal for the first voltage supply, and wherein another portion of the second partial matching network is switchably connectable to the terminal for the small-signal ground potential, and where an electrical output signal can during operation be provided between sides of a first decoupling element and a second decoupling element facing away from the photodiode.

15 Claims, 4 Drawing Sheets

(51) Int. Cl.
*H03F 1/08* (2006.01)
*H03F 3/08* (2006.01)

(58) Field of Classification Search
USPC .......................................................... 398/202
See application file for complete search history.

(56) References Cited

U.S. PATENT DOCUMENTS

| 2006/0034622 A1* | 2/2006 | Day ..................... H03F 3/45179 |
| | | 398/208 |
| 2006/0177228 A1* | 8/2006 | Loboda .................. H04B 10/66 |
| | | 398/202 |
| 2019/0334482 A1* | 10/2019 | Bayruns ............... H03G 3/3084 |

FOREIGN PATENT DOCUMENTS

| DE | 102022201070 | 8/2023 |
| EP | 0711045 | 5/1996 |
| EP | 0971492 | 1/2000 |

OTHER PUBLICATIONS

International Search Report and Written Opinion for International (PCT) Patent Application No. PCT/EP2023/052423, dated Apr. 28, 2023, 14 pages.

* cited by examiner

ELECTRO-OPTICAL MIXER

CROSS REFERENCE TO RELATED APPLICATIONS

This application is a national stage application under 35 U.S.C. 371 and claims the benefit of PCT Application No. PCT/EP2023/052423 having an international filing date of 1 Feb. 2023, which designated the United States, which PCT application claimed the benefit of German Patent Application No. 10 2022 201 070.1 filed 1 Feb. 2022, the disclosures of each of which are incorporated herein by reference in their entireties.

The invention relates to an electro-optical mixer.

BACKGROUND

In many use cases, optical data are sent over long distances using optical fibers.

Optical fibers are also used in the radar field for distributing the local oscillator signal (LO).

In order to send the data or the radar signal wirelessly, the optical signal must be converted into an electrical signal before being upconverted.

The conversion of optical signals into electrical signals is performed using a transimpedance amplifier (TIA). Upconverting to the desired RF band is then performed using an electric mixer.

The output signal from the TIA can then be further preprocessed using a DC-balanced buffer and a variable gain amplifier (VGA) before this signal is multiplied by another signal using a mixer.

Figure 1:
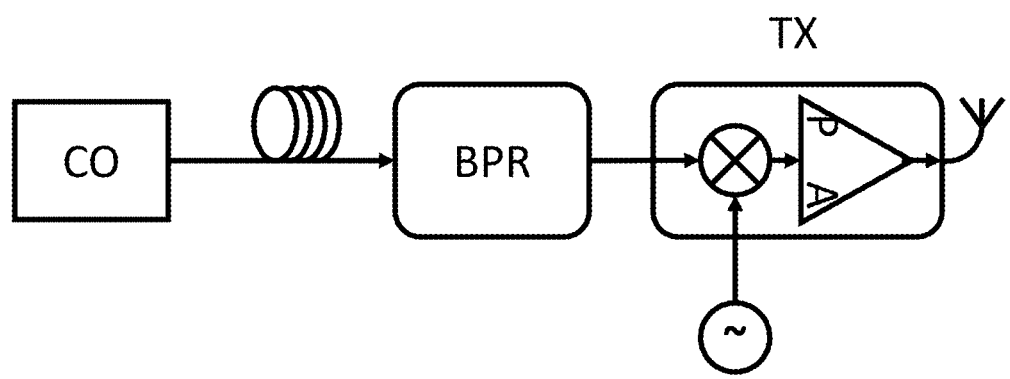

A block diagram depicting the most relevant prior art is shown in FIG. 1. In this case, an optical signal is routed via a fiber from a switching center CO to an optical baseband receiver BPR and preprocessed there (by way of example, by a processing method using a photodiode, a transimpedance amplifier, a DC-balanced buffer, and a variable gain amplifier (VGA)) and then upconverted to the desired RF band in an electrical stage TX using a mixer (and a further signal). In this case, the optical baseband receiver BPR and the electrical stage TX are provided to a BICMOS integrated circuit, for example.

In this process, both the transimpedance amplifier and the electrical mixer increase the complexity of the overall system.

In addition, the transimpedance amplifier requires a separate chip area of a size of approximately 0.25 mm$^2$, which increases the costs of such a system.

In addition, each individual component has a certain bandwidth. By interconnecting the two components, the bandwidth of the overall system is determined by the bandwidth of the individual components, and thus by the component having the lowest bandwidth. In order to detect high-frequency optical signals, a separate TIA must be used to minimize the influence of parasitic capacitance. This TIA generates additional noise.

These components also generate power loss, which impairs the efficiency of the system. Therefore, this solution is not suitable for use in low-power applications or battery-operated systems.

It should also be noted that providing a transimpedance amplifier as a separate component increases the risk of failure of the entire system.

In some applications, it may be necessary to use only a certain frequency band from the optical signal of any desired width. This is normally achieved using a filter behind the TIA. This channel select filter is based on passive components.

Given that actual passive components always have parasitic resistance, the noise increases enormously.

In addition, the (passive) components require a large chip area, thereby greatly increasing system costs.

In some applications, it may be necessary for a single unit to be switched off while a data signal and/or clock signal is still being transmitted through the fiber to other systems.

A variety of techniques can be used to implement this.

Figure 2:
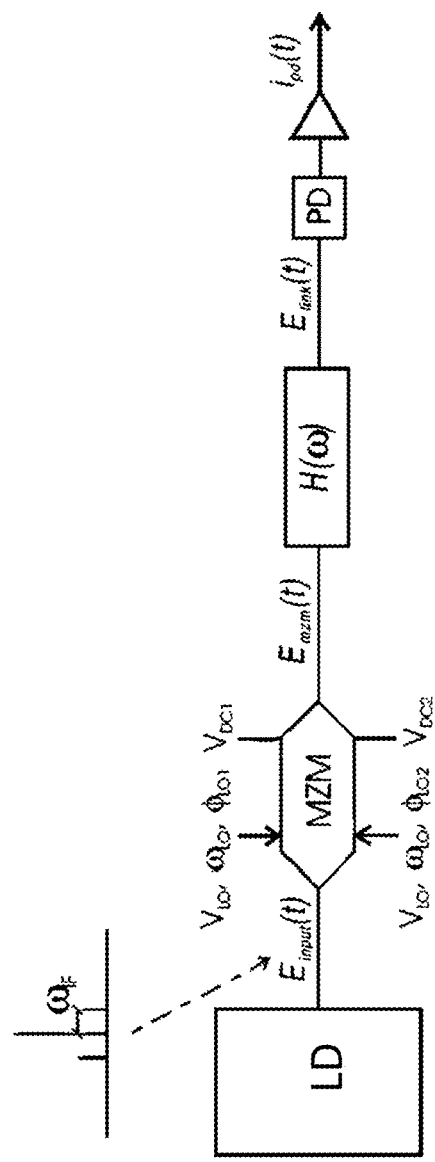

By means of a Mach-Zehnder modulator (MZM) in front of a photodiode, the optical power at the photodiode can be individually set to zero. Such an approach is shown in FIG. 2.

Here, an optical input signal from a laser diode LD is guided to a Mach-Zehnder modulator MZM. The output signal from the Mach-Zehnder modulator MZM is also optical and must still be converted into an electrical signal using a photodiode PD. This electrical signal is then a current signal. For further processing, this current signal must still be converted into a voltage signal in a transimpedance amplifier.

Given that Mach-Zehnder modulators require a quite large area and very high control voltages, this solution is disadvantageous for integrated circuits and extremely scaled technologies in particular.

Voltages in the range of 2-3 V are thus required to control a Mach-Zehnder modulator. In modern transistors with dimensions in the nanometer range, this voltage range can already lead to the failure of driver components.

In addition, these driver components in turn increase the mixer noise.

Furthermore, the MZM requires several square millimeters of chip area, which in turn increases the overall price of the system.

Finally, MZMs only have a bandwidth in the range of <30 GHZ, thereby making this solution unsuitable for HF applications.

The supply voltage can be switched off as an alternative to Mach-Zehnder modulators. However, the disadvantage of this technique is that strong currents would have to flow through the corresponding switching transistors. Cooling capacities would have to be planned for in order to compensate for the corresponding power dissipation in the transistors, which would increase the system complexity enormously.

As yet another alternative, there would be the option of using an analog latch to freeze the signals in a DC state after the transimpedance amplifier.

However, analog latches are very expensive in the mm wave range, which would greatly increase the system cost.

Furthermore, in the known systems—insofar as they are available—the matching network is only designed as a bandpass, so it is as a rule impossible to select different frequency bands.

On this basis, the object of the invention is to specify a solution that avoids one or more of the problems in the prior art.

The object is achieved by an electro-optical mixer having electrical output according to claim 1. Further advantageous embodiments of the invention are the subject of the dependent claims, the description, and the figures.

Figure 3:
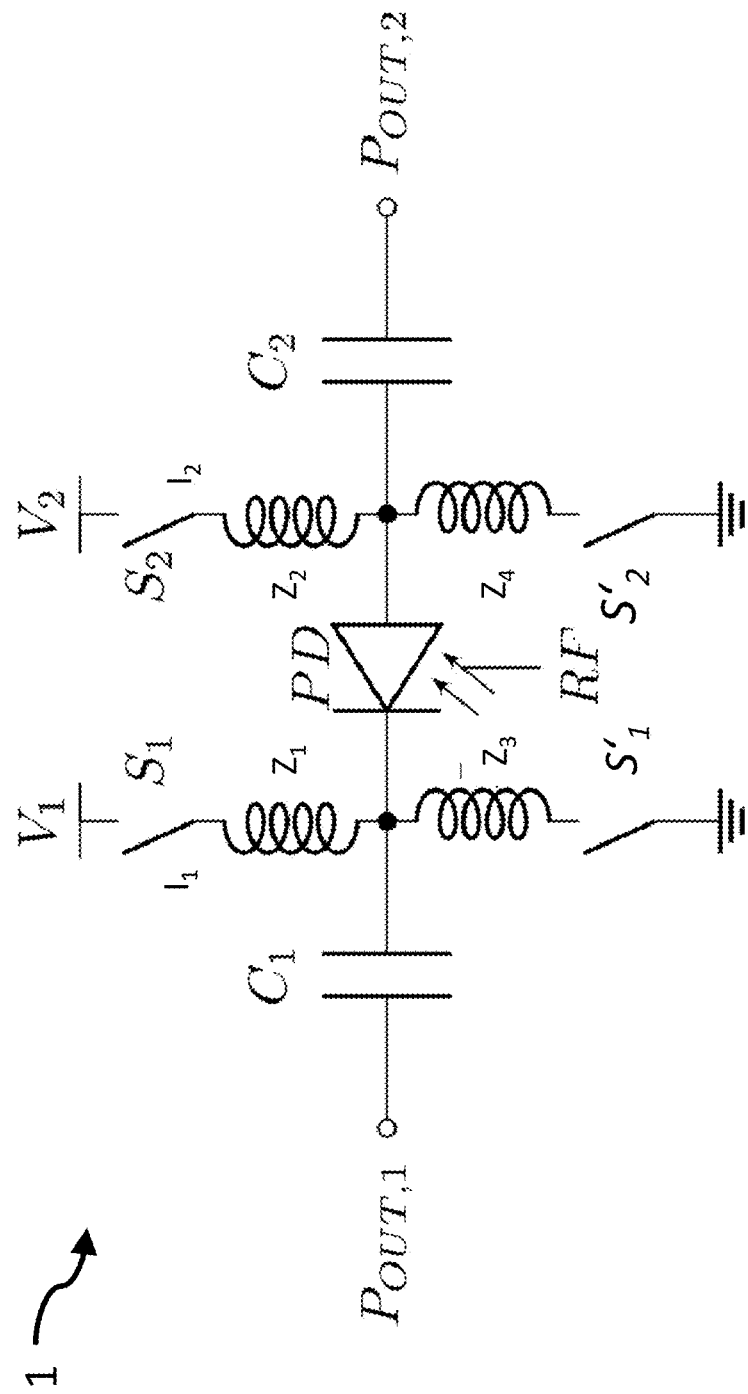
Figure 4:
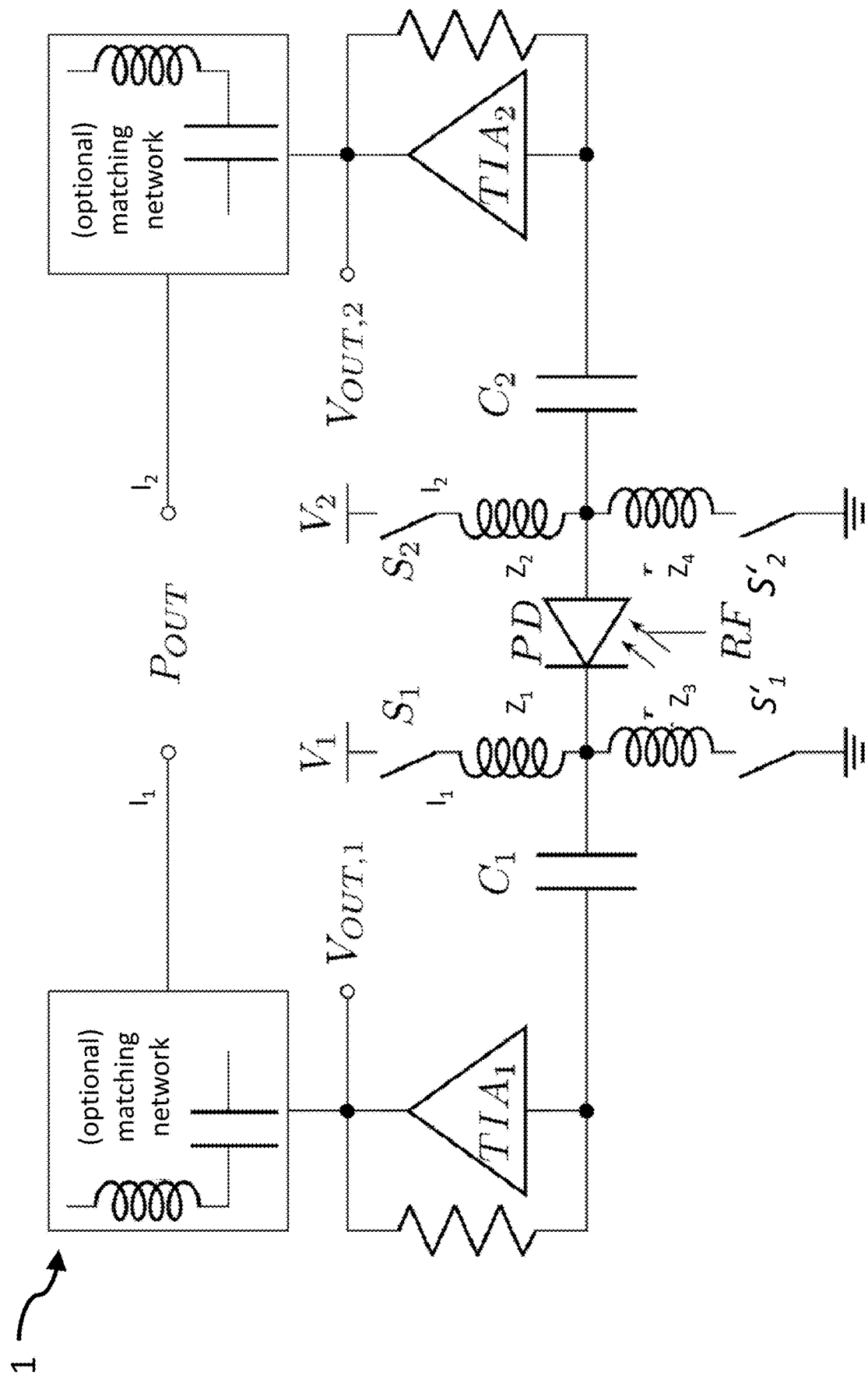

Embodiments of the present invention will be described by way of example with reference to the appended drawings, which show:

FIG. 1 an embodiment according to the prior art,

FIG. 2 a further embodiment according to the prior art,

FIG. 3 a schematic illustration of embodiments of the invention,

FIG. 4 a further schematic illustration of further embodiments of the invention.

DETAILED DESCRIPTION OF THE INVENTION WITH REFERENCE TO THE DRAWINGS

The invention will be described in greater detail hereinafter with reference to the drawings. In this context, it should be noted that various aspects will be described which can each be used individually or in combination. In other words, any aspect can be used with various embodiments of the invention, unless explicitly described purely as an alternative.

Furthermore, for the sake of simplicity, only one entity will as a rule be referred to hereinafter. Unless explicitly noted, however, the invention can also comprise a plurality of the relevant entities. In this context, the use of the words "a," "an," and "one" should only be understood as an indication that at least one entity is being used in a single embodiment.

Insofar as methods are described hereinafter, the individual method steps can be arranged and/or combined in any desired sequence, unless the context explicitly indicates otherwise. Furthermore, the methods can be combined with each other unless explicitly indicated otherwise.

As a rule, specifications with numerical values should not be understood as exact values, but as including a tolerance of +/−1% to +/−10%.

Reference to standards, specifications, or norms should be understood as reference to standards, specifications, or norms that are/were valid at the time of the application and/or—if priority being is claimed—also at the time of the priority application. However, this should not be understood as a general exclusion of applicability to subsequent or replacement standards, specifications, or norms.

FIGS. 3 and 4 show an electro-optical mixer 1 having an electrical output according to embodiments of the invention.

The electro-optical mixer 1 comprises at least one photodiode PD for converting an incident optical signal.

The electro-optical mixer 1 further comprises at least one first terminal and at least one second terminal, whereby a first voltage supply $V_1$ can (in each case) be connected to the first terminal or the respective first terminals, and a second voltage supply $V_2$ can (in each case) be connected to the second terminal or the respective second terminals.

Alternatively, a first power supply $I_1$ can (in each case) be connected to the first terminal or the respective first terminals, and a second power supply $I_2$ can (in each case) be connected to the second terminal or the respective second terminals.

The electro-optical mixer 1 also comprises at least one terminal for a small-signal ground potential for the first voltage supply $V_1$ and the second voltage supply $V_2$. The small-signal ground potential can be any desired potential, but in particular can be the ground potential of the overall circuit.

The electro-optical mixer 1 comprises a first partial matching network—represented by $Z_2$, $Z_4$—which is arranged on the anode side of the photodiode PD, whereby a portion of the first partial matching network—in this case $Z_2$—is switchably connectable to the terminal for the second voltage supply $V_2$ using switch $S_2$, and whereby another portion of the first partial matching network—in this case $Z_4$—is switchably connectable to the terminal for the small-signal ground potential using switch $S'_2$.

The electro-optical mixer 1 comprises a second partial matching network—represented by $Z_1$, $Z_3$—which is arranged on the cathode side of the photodiode PD, whereby a portion of the second partial matching network—in this case $Z_1$—is switchably connectable to the terminal for the first voltage supply $V_1$ using switch $S_1$, and whereby another portion of the second partial matching network—in this case $Z_3$—is switchably connectable to the terminal for the small-signal ground potential using switch $S'_1$.

Matching networks must in this case be provided with impedance matching, meaning that AC voltage isolation by a single capacitor (as a decoupling element) should not be understood as a matching network.

The elements of the first partial matching network—in this case $Z_2$, $Z_4$—and the second partial matching network—in this case $Z_1$, $Z_3$—feature an inductive and/or resistive character and/or a capacitive character.

The electro-optical mixer 1 further comprises a first decoupling element $C_1$ which is arranged on the cathode side of the photodiode PD, and a second decoupling element $C_2$ which is arranged on the anode side of the photodiode PD.

The first decoupling element $C_1$ and the second decoupling element $C_2$ in turn feature an inductive and/or resistive character and/or a capacitive character.

During operation, an electrical output signal can then be provided between the sides of the first decoupling element $C_1$ and the second decoupling element $C_2$ facing away from the photodiode PD.

Using the arrangement presented, a straightforward, space-saving, and frequency-adjustable solution can be provided, which is also able be switched off.

In one embodiment of the invention, the electrical output signal is respectively fed to a transimpedance amplifier $TIA_1$, $TIA_2$.

In a further embodiment of the invention, switches $S_1$, $S_2$, $S'_1$, $S'_2$ are designed as any desired switching element, but in particular as semiconductor switches, e.g. as transistors.

According to one embodiment of the invention, the circuit can, given a suitable switch selection, operate as an optical receiver.

According to yet another embodiment of the invention, the electro-optical mixer can be deactivated using switches $S_1$, $S_2$, $S'_1$, $S'_2$.

Without limiting the generality of the invention, the switch positions of switches $S_1$, $S_2$, $S'_1$, $S'_2$ can be controlled by any desired signal, in particular by an optical signal and/or by an electrical signal and/or by a mechanical signal.

In one embodiment of the invention, the elements of the first partial matching network—in this case $Z_2$, $Z_4$—and the second partial matching network—in this case $Z_1$, $Z_3$—feature an inductive character, whereby the inductive character is provided by coils and/or by lines.

In one embodiment of the invention, the elements of the first partial matching network—in this case $Z_2$, $Z_4$—and the second partial matching network—in this case $Z_1$, $Z_3$—alternatively or additionally feature a capacitive character, whereby the capacitive character is provided by capacitors and/or lines.

Without limiting the generality of the invention, the system is implemented in semiconductor technology, e.g. BiCMOS.

However, the system can also be implemented using discrete components.

Obviously, however, the electro-optical mixer can also be partially integrated and, e.g., comprise individual elements as discrete components.

In all of the embodiments, it can be provided that the system is able to operate using any desired polarized light. The system can in particular operate using purely TE polarized light or using purely TM polarized light. The system can also operate using purely TE polarized light and purely TM polarized light and thus, e.g., provide the processing for polarization multiplexing.

In the embodiment shown by way of example in FIG. 3, the optical signal RF is detected in the photodiode PD and converted into an electrical signal. The first partial matching network and the second partial matching network couple out the electrical signal and generate or select the frequency band via the impedance matching provided by the first partial matching network and the second partial matching network.

In the example shown in FIG. 3, the impedances $Z_1 \ldots Z_4$ are formed by inductors (without, however, being limited to this), but the implementation of impedances $Z_1 \ldots Z_4$ is not limited to coils and capacitors; other passive components can also be used.

As a result of the anode and cathode impedance of the photodiode PD depending on the operating point, the channel/frequency band can be selected by varying the voltages $V_1$, $V_2$ or currents $I_1$, $I_2$, because for each different voltage the matching network formed from the first partial matching network and the second partial matching network in interaction with the impedances of the photodiode PD becomes resonant with (other frequencies). The actual mixing process is provided in the H-bridge consisting of $S_1$, $S_2$, $S'_1$, $S'_2$, $Z_1$, $Z_2$, $Z_3$, $Z_4$, and the PD.

In the event that voltage supplies $V_1$ and $V_2$ respectively provide a voltage different from zero that is larger in magnitude (compared to the small-signal ground potential), the following can then be observed:

When switches $S_1$ and $S'_1$ are closed and the remaining switches are open, the photodiode PD is in the blocking direction and the dark current is detected in addition to the photocurrent.

If, however, switches $S_2$ and $S'_2$ are closed and the remaining switches are open, the diode is in forward operation and the current is dominated by the diode current, as a result of which the photocurrent is no longer detectable.

However, if switches $S'_1$ and $S'_2$ are closed and the other switches are open, the bandwidth of the photodiode PD decreases, so only low-frequency signals are able to be detected.

If, however, switches $S_2$ and $S'_2$ are closed (long-term) and the remaining switches are open, then $I_{photo} \ll I_{diode}$. In this case, the mixer 1 is switched off.

These explanations obviously also apply in a corresponding manner to positive currents $I_1$, $I_2$ which are each different from zero.

It should of course be noted that, in the event that voltage supplies $V_1$ and $V_2$ respectively provide a voltage different from zero that is smaller (compared to the small-signal mass potential), the description specified hereinabove is also valid, whereby the indices should be exchanged. Obviously, these explanations also apply correspondingly to negative currents $I_1$, $I_2$ which are each different from zero.

FIG. 4 shows a further embodiment of the invention. In this case, the passive core remains, as in FIG. 3. However, in the event that the capacitances are very large, i.e., if $C_1$, $C_2 \rightarrow \infty$, and the impedances $Z_1$, $Z_2$, $Z_3$, $Z_4$ (e.g., inductances) were selected appropriately, then broadband signals will also be detected.

The currents can in this case be converted into voltages using transimpedance amplifiers $TIA_1$ and $TIA_2$. However, if power is desired at the output, then the voltages can be transformed into power at a certain impedance by optional matching networks (at the outputs of transimpedance amplifiers $TIA_1$ and $TIA_2$).

In addition, the system is not limited to only two transimpedance amplifiers TIAs. Any desired number of TIAS that are sensitive to various frequencies can be used. After selecting the appropriate transimpedance amplifier, a channel selection can then take place.

The embodiments shown in FIG. 4 enable both broadband and narrowband operation.

The embodiments presented here utilize an H-bridge as opposed to Gilbert cells or non-linearized components. In addition, the systems can be implemented as a broadband system or using channel selection. The system also offers the option of being deactivatable.

The electro-optical mixer according to the invention comprises an H-bridge which enables an optical signal to be directly multiplied with an electrical signal without a transimpedance amplifier being present. The electro-optical mixer according to the invention consumes less power, with less complexity and less noise. The chip area is also reduced according to the size of the TIA or the Mach-Zehnder modulator. The bandwidth can be adjusted by using appropriate partial matching networks. Likewise, the bandwidth may be influenced by the semiconductor technology used. If transistors are used as switches $S_1$, $S_2$, $S'_1$, $S'_2$, it should be sufficient for the voltage (in comparison to the Mach-Zehnder modulator) to only reach a voltage of $>3U_T$ ($\approx 75$ mV), which is significantly less than 2-3 V.

What is claimed is:

1. An electro-optical mixer (4) having an electrical output, the electro-optical mixer comprising:
   a photodiode for converting an incident optical signal,
   a first terminal,
   a second terminal,
   wherein a first voltage supply can be connected to the first terminal, and a second voltage supply can be connected to the second terminal, or a first power supply can be connected to the first terminal, and a second power supply can be connected to the second terminal,
   a terminal for a small-signal ground potential for the first voltage supply and the second voltage supply,
   a first partial matching network which is arranged on an anode side of the photodiode, wherein a portion of the first partial matching network is switchably connectable to the second terminal for the second voltage supply, and wherein another portion of the first partial matching network is switchably connectable to the terminal for the small-signal ground potential,
   a second partial matching network which is arranged on a cathode side of the photodiode, wherein a portion of the second partial matching network ($Z_1$) is switchably connectable to the first terminal for the first voltage supply, and wherein another portion of the second partial matching network is switchably connectable to the terminal for the small-signal ground potential,
   wherein elements of the first partial matching network and the second partial matching network feature an inductive and/or a resistive character and/or a capacitive character, a first capacitive element which is arranged on the cathode side of the photodiode, a second capacitive element which is arranged on the anode side of the photodiode, wherein a first decoupling element and a second decoupling element feature an inductive and/or a resistive character and/or a capacitive character, wherein an electrical output signal is provided during operation between sides of the first decoupling element and the second decoupling element facing away from the photodiode.

2. The electro-optical mixer according to claim 1, wherein the electrical output signal is fed to a transimpedance amplifier.

3. The electro-optical mixer according to claim 1, wherein switches that enable the switchable connections are designed as any switching element.

4. The electro-optical mixer according to claim 1, wherein switches that enable the switchable connections are designed as semiconductor switches.

5. The electro-optical mixer according to claim 1, wherein, given a suitable switch selection, the electro-optical mixer is operable as an optical receiver.

6. The electro-optical mixer according to claim 1, wherein the electro-optical mixer is able to be deactivated by means of switches that enable the switchable connections.

7. The electro-optical mixer according to claim 1, wherein switch positions of switches that enable the switchable connections are controllable by a signal.

8. The electro-optical mixer according to claim 1, wherein switch positions of switches that enable the switchable connections are controllable by an optical signal and/or by an electrical signal and/or by a mechanical signal.

9. The electro-optical mixer according to claim 1, wherein the elements of the first partial matching network and the second partial matching network feature an inductive character, wherein the inductive character is provided by coils and/or by lines.

10. The electro-optical mixer according to claim 1, wherein the elements of the first partial matching network and the second partial matching network feature a capacitive character, wherein the capacitive character is provided by capacitors and/or lines.

11. The electro-optical mixer according to claim 1, wherein the electro-optical mixer is implemented in semiconductor technology.

12. The electro-optical mixer according to claim 1, wherein the electro-optical mixer is implemented using discrete components.

13. The electro-optical mixer according to claim 1, wherein the electro-optical mixer is operable using polarized light.

14. The electro-optical mixer according to claim 1, wherein the electro-optical mixer is operable using purely TE polarized light and/or using purely TM polarized light.

15. The electro-optical mixer according to claim 1, wherein:

the electrical output signal is fed to a transimpedance amplifier;

switches that enable the switchable connections are designed as semiconductor switches;

given a suitable switch selection, the electro-optical mixer is operable as an optical receiver;

the electro-optical mixer is able to be deactivated by means of the switches;

switch positions of the switches are controllable by an optical signal and/or by an electrical signal and/or by a mechanical signal;

the elements of the first partial matching network and the second partial matching network feature an inductive character, and wherein the inductive character is provided by coils and/or by lines;

the elements of the first partial matching network and the second partial matching network feature a capacitive character, and wherein the capacitive character is provided by capacitors and/or lines;

the electro-optical mixer is implemented in semiconductor technology;

the electro-optical mixer is implemented using discrete components; and the electro-optical mixer is operable using polarized light.

* * * * *